United States Patent [19]
Purinton et al.

[11] Patent Number: 6,063,511
[45] Date of Patent: May 16, 2000

[54] LOW COST THIN FILM MAGNETODIELECTRIC MATERIAL

[75] Inventors: Donald L. Purinton; Oren B. Kesler, both of Plano, Tex.

[73] Assignee: Texas Instruments Incorporated, Dallas, Tex.

[21] Appl. No.: 08/816,095

[22] Filed: Mar. 14, 1997

Related U.S. Application Data

[60] Provisional application No. 60/016,147, Apr. 24, 1996.

[51] Int. Cl.$^7$ ................ B32B 9/00; G11B 5/66; B05D 5/12

[52] U.S. Cl. ............ 428/692; 428/694; 427/127; 427/128; 422/50; 422/186

[58] Field of Search .................. 428/545, 546, 428/549, 375–380, 323–330, 694 B, 692; 360/56, 110; 252/73–75; 427/302–307, 536, 475, 130, 128, 160, 202, 421, 598, 127; 422/50, 186

[56] References Cited

U.S. PATENT DOCUMENTS

| | | | |
|---|---|---|---|
| 2,418,479 | 4/1947 | Pratt | 117/64 |
| 2,954,552 | 9/1960 | Halpern et al. | 343/18 |
| 3,845,499 | 10/1974 | Ballinger | 360/56 |
| 4,606,848 | 8/1986 | Bond | 252/511 |
| 5,455,116 | 10/1995 | Nagano et al. | 428/545 |

Primary Examiner—Louise N. Leary
Attorney, Agent, or Firm—Mark A. Valetti; Wade James Brady, III; Richard L. Donaldson

[57] ABSTRACT

A device and method of making the device for regulating electromagnetic radiations in a predetermined frequency range, which comprises a substrate and a coating mixture on a surface of the substrate. The coating mixture is provided by mixing together: (a) a plurality of flakes of a magnetic or ferrite material having substantial length and width dimensions relative to their thickness, the thickness of substantially all of the flakes being less than the skin depth of all frequencies in the predetermined frequency range, (b) at least one surfactant, (c)) a vaporizable electrically insulating material and (d) a solvent. The mixture is sprayed onto the surface of the substrate, either with or without a magnetic field at the surface, and the solvent is removed to retain the flakes on the substrate spaced from each other by the electrically insulating material and disposed substantially parallel to the portion of the plane of the surface thereunder. The substrate can be any one of at least an automobile, an aircraft, an electronic enclosure, a portion of a building, a tower causing electromagnetic interference or a location for placement of an antenna. The device is preferably an absorber for electromagnetic radiations, particularly for use on the surfaces of a mobile device such as an automobile, aircraft or personal electronic device. The flakes are any magnetic or ferrite material than can be provided in flake form in the thickness range required.

26 Claims, 1 Drawing Sheet

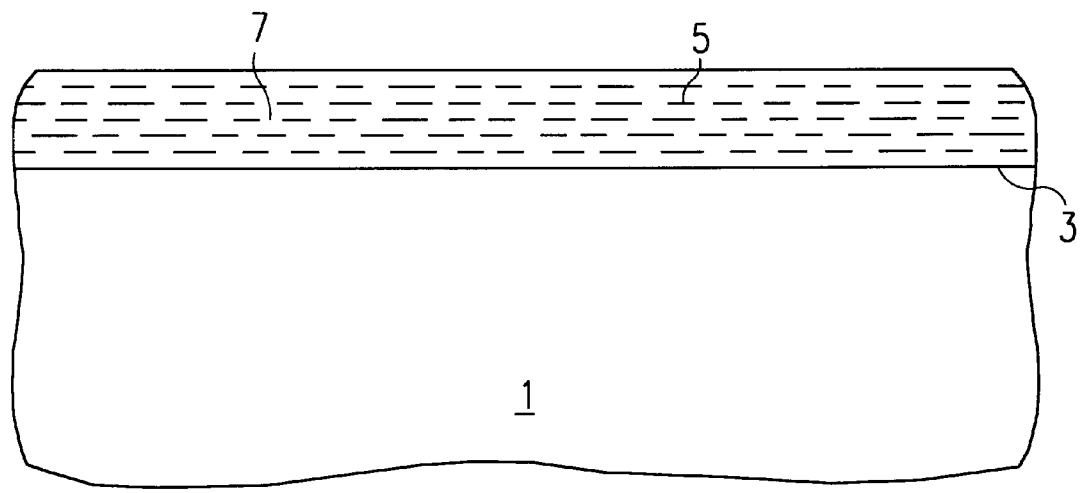

LOW COST THIN FILM MAGNETODIELECTRIC MATERIAL

This Application claims the benefit of U.S. Provisional Ser. No. 60/016,147 filed Apr. 24, 1996.

BACKGROUND OF THE INVENTION

1. Field of the Invention

This invention relates to a method of producing very thin films of magnetic material and to the material.

2. Brief Description of the Prior Art

Very thin films with layers of magnetic material have been known in the prior art. A dissertation of Rodger Michael Walser entitled *A Study of Thin Film Magnetodielectrics*, 1967, University of Michigan, discloses a material consisting of several stacked layers of alternating thin magnetic or ferrite material films surrounded by dielectric material wherein the magnetic material films are each less than skin depth (about 0.3 microns) because of the need to limit the thickness of each layer to less than an electromagnetic skin depth at the frequency of use. The "skin depth" is the distance below the surface of an electrical conductor in which current will flow at the frequency of operation, this being a well known phenomenon.

The material described by Walser, known for its high complex dielectric and magnetic susceptibility at frequencies above and below 1 GHz. The processes required to fabricate this material include thin film vapor deposition and photolithography or micromasking repeated many times to produce an appreciable thickness for practical use. The cost of commercial manufacture and application of this material, which provides an ultra thin magnetic absorber, is very high, therefore severely limiting its use to very few applications having small areas of concern and a high dollar value. The above described film as well as the low cost magnetodielectric material of this invention has utility in at least the following areas: size reduction of inductors on electronic integrated circuit chips and miniaturization of electronic circuits, electromagnetic interference (EMI) reduction in electronic packages, modules and housings, RF multipath reduction from buildings or towers and size reduction and/or performance improvement of UHF, VHF and microwave antennas.

Iron carbonyl powder in a plastic or rubber and ceramic such as hexagonal ferrites have been used in the above applicatons. Both of these types of materials have a high specific gravity (as high as 5 in iron carbonyl powder in plastic) and have relatively low values of magnetic susceptance, requiring thickness and weights that are an order of magnitude greater to accomplish the same effects and tasks.

It is therefore apparent that there is a substantial need for a low cost form of a material of the type described by Walser. To date, no such material is known which has relatively low cost.

SUMMARY OF THE INVENTION

In accordance with the present invention, there is provided a structure having substantially the properties of the thin films discussed in the above noted Walser dissertation which can be fabricated at sufficiently lower cost relative to the prior art to substantially increase the number of applications to which the thin films can be economically applied. Because of the very substantial cost reduction of the material of the present invention, a reduction in the electromagnetic properties by a factor even of about two is considered most acceptable. Such a reduction can be accommodated by using a slightly thicker coating which still is an order of magnitude less in thickness and lower in cost than conventional carbonyl iron electromagnetic material.

Briefly, there is provided a plurality of "flakes" of the desired magnetic material, any magnetic material that can be provided in "flake" form and having the required properties for the intended end use (such as, for example, frequency range of interest) being included for such use. Each of the "flakes" is defined as having a very substantial length and width dimension as compared with the thickness dimension (being almost two-dimensional). The thickness dimension of each flake is less than the skin depth at the intended frequency or frequencies of operation, this being about 0.3 micron in the 1 GHz range, the preferred thickness therefore being about 0.1 micron or less in about the 1 GHz range (it being understood that a very small percentage of the flakes may exceed this maximum thickness due to an inability to obtain a powder with all particles having a thickness less than the maximum that is allowable).

Magnetic materials that can be used are, for example, for frequencies below 1 GHz: 80Ni/20Fe, sendust (FeSi/Al), amorphous CoZrNb and amorphous CoFeBSi and for frequencies above 1 GHZ: 95Co/5Fe, amorphous CoZrNd, CoCr and amorphous TbFe. Plural magnetic materials can be combined either in the material itself or in separate layers or the same layer, each responsive to a different frequency range, in the event a coating is desired for operation in a range broader than is available by use of a single coating material. For example, two or more different flakes can be added together in a layer of material or a high frequency material may be placed over a layer having low frequency flakes or layers of low and high frequency flakes can be interleaved. The flakes are formed, for example, by ball milling or roll milling the alloys starting with the powder form. The flake can also be made by cutting long lengths of ribbon into small platelets. Also, flakes can be generated from molten metal by rapid solidification via the melt spin process. The flakes are mixed and coated with one or more surfactants which make the flakes float therein or one or more coupling agents which make the flakes sink therein, an electrically insulating resin material and a solvent sufficient to provide a sprayable mixture. The amount of surfactant or coupling agent used is from a finite amount approaching zero to about 10% by weight of the flakes. The flakes sink in the absence of a surfactant. Steric acid is the preferred surfactant. The preferred resin is Epoxy 4515 LV of Emmerson, Cuming, Grace, though almost any epoxy can be substituted therefor. Other resins that can be used, but are not limited to, are urethanes, polyesters, epoxys, cyanate esters, polyimides, silicones, synthetic rubbers and elastomers such as Neoprene, nitriles, polyisoprene, fluoroelastome, butyl and buna N and inorganic polymers such as silanes, silazanes, siloxanes and ceramic sol gels. Leveling and air removal chemicals such as Modaflow of Monsanto, a combination of BYK 354 (petroleum solvent (naptha) diisobytyl detone) and BYK 351 from BYK can be added to the resin in amounts of from about 0.1 to about 1% by weight. Coupling agents include, but are not limited to, silanes, aluminates, titanates and zirconates which are added to the resin in amounts of from about 0.5 to about 2% by weight. The flakes are added to the resin in a weight percent of from about 40 to about 95 percent by weight. The solvents are added to the resin in an amount of from about 20 to about 300% by weight. Appropriate solvents include, but are not limited to, toluene, MIBK, MIAK, cyclohexanone, methylethyl ketone, acetone, hexanol, octonol, ethyl acetate, butyl acetate, isobutyl alcohol, methanol, methylisobutyl ketone and methylisoamyl ketone. While the amount of electrically insulating material used is not critical, it is desired that the amount used be as small as possible commensurate with isolating the flakes from each other (i.e, coat substantially each of said flakes) within a suspension of the solvent and the electrically insulating material and providing minimum ultimate thickness of the coating for the purpose intended.

The components are mixed and sprayed onto a substrate using, for example, a standard paint sprayer or the like onto the surface to be coated with the solvent then being allowed to evaporate. The surfactant causes the flakes to lie either on the surface or on the bottom of the sprayed composition with the resin either lying over or under the flakes. The flakes align themselves generally parallel to the plane of the surface being sprayed. When the solvent evaporates, it leaves the flakes each positioned over the surface of the substrate onto which it was sprayed and parallel to the plane thereof with the electrically insulating material disposed either thereover or thereunder. The result is a plurality of flakes, all positioned parallel to the surface immediately thereunder, each flake being insulated from the remaining flakes by the resin. Material performance can be increased by aligning the platelet flakes in the spraying process by use of a magnetic field. That is, by additionally subjecting the surface to a static or pulsed magnetic field during the spraying or painting operation, the magnetic platelets will tend to align. The platelets will line up with the direction of the magnetic field. Therefore, a magnetic field parallel to the surface of the substrate would be preferred for flake or platelet positioning as discussed above. This alignment will be maintained upon curing of the paint even after the magnetic field is removed. Thus, the low cost material process may achieve performance similar to the higher cost Walser material.

The coating provided in accordance with the present invention has a magnetic susceptibility and a dielectric susceptibility of an order of magnitude or more greater than iron carbonyl in plastic and hexagonal ferrites. In addition, the effective dielectric constants may be very large. This means that about 50 mils of this coating is equal to about one half inch of the iron carbonyl in plastic discussed above in electromagnetic wave properties.

It follows that another use of the coating in accordance with the present invention involves the ability to reduce the thickness of an antenna that is flush mounted on a surface, especially an electrically conductive surface, such as metal or epoxy graphite composite. The coating is placed between the antenna element and the electrically conductive surface. Normally, a coating of conventional materials would require greater thickness by an order of magnitude. This greater thickness causes the antenna to protrude above the surface, losing the qualities of a flush mounting, for example, a communication antenna mounted on the wing of an aircraft or the roof of an automobile.

It further is apparent that the size of other devices such as inductors can be decreased by use of a coating in accordance with the present invention. For example, a coating as described above can be placed over inductors formed in integrated circuits with the resulting inductor required occupying less real estate than is required in the present state of the art.

BRIEF DESCRIPTION OF THE DRAWING

The FIGURE is a cross section of layers of metal or ferrite flake randomly placed and oriented with the flat of each flake being parallel to the substrate.

DESCRIPTION OF THE PREFERRED EMBODIMENT

Referring to the FIGURE, there is shown a substrate 1 having a surface 3. Flakes 5 of magnetic stainless steel are disposed over the surface 3, each of the flakes 5 being essentially parallel to the plane of the surface 3 directly thereunder. The flakes 5 are separated from each other and from the substrate 1 by an electrically insulating material 7 whereby each of the flakes is electrically isolated from the other flakes. The substrate 1 can be, for example, a portion of the surface of an automobile or a personal electronic device with the coating of magnetic flakes thereon operating as an absorber providing a thin isolating substrate for an antenna.

The coating is applied to the substrate by providing the flakes 5, a preferred such material being Novamet Extra Fine Stainless Steel Flake Paste which is made from very corrosion resistant 316L stainless steel with average particle size 15–20 microns with flake thickness of less than one half micron which is magnetic. Ninety (90) grams of the flakes 5 that were previously coated with five (5) grams of steric acid were mixed with twenty (20) grams electrically insulating Epoxy 4515 LV Clear of Emmerson, Cuming, Grace and twenty (20) grams of methylethyl ketone. The components were mixed and sprayed onto the substrate using a standard paint sprayer with the solvent then being allowed to evaporate. The flakes 5 aligned themselves generally parallel to the plane of the surface 3 being sprayed. When the solvent evaporated, the flakes 5 were each positioned over the surface 3 of the substrate 1 onto which they were sprayed and parallel to the plane thereof with the electrically insulating material disposed to envelope all or most of the flakes. The result was a plurality of flakes 5, all positioned parallel to the surface 3 immediately thereunder, each flake being insulated from the remaining flakes by the epoxy 7. The coating acted as a good absorber for electromagnetic waves.

While the preferred embodiment of the surface 3 herein is an exterior surface of a mobile device or personal electronic device with the coating used as a substrate for an antenna, the coating can also be used for reduction of electromagnetic interference, with the inductor portion of an integrated circuit, a recording head for electronic storage devices (audio, video or digital) or as an absorber shield in general or in conjunction with other magnetic media.

Though the invention has been described with respect to specific preferred embodiments thereof, many variations and modifications will immediately become apparent to those skilled in the art. It is therefore the intention that the appended claims be interpreted as broadly as possible to include all such variations and modifications.

We claim:

1. A device for regulating electromagnetic radiations in a predetermined frequency range, which comprises:
   (a) a substrate; and
   (b) a coating on a surface of said substrate which comprises:
      (i) a plurality of flakes of at least one of magnetic or ferrite material having substantial length and width dimensions relative to their thickness to provide two opposing major surfaces, one of their two major surfaces disposed substantially parallel to the portion of the plane of said surface thereunder;
      (ii) the thickness of substantially all of said flakes being less than the skin depth of all frequencies in said predetermined frequency range; and
      (iii) a vaporizable electrically insulating material spacing said flakes from each other.

2. The device of claim 1 wherein said device is one of a mobile vehicle or personal electronic device and said coating is an electromagnetic wave absorber for an antenna.

3. The device of claim 1 wherein said flakes are selected from the group consisting of magnetic stainless steel, 80Ni/20Fe, sendust (FeSi/Al), amorphous CoZrNb, amorphous CoFeBSi, 95Co/5Fe, amorphous CoZrNd, CoCr and amorphous TbFe.

4. The device of claim 2 wherein said flakes are selected from the group consisting of magnetic stainless steel, 80Ni/20Fe, sendust (FeSi/Al), amorphous CoZrNb, amorphous CoFeBSi, 95Co/5Fe, amorphous CoZrNd, CoCr and amorphous TbFe.

5. The device of claim 1 wherein said electrically insulating material is selected from the group consisting of urethanes, polyesters, epoxys, cyanate esters, polyimides, silicones, synthetic rubbers and Neoprene, nitriles, polyisoprene, fluoroelastomer, butyl and buna N elastomers and silanes, silazanes, siloxanes and ceramic sol gels inorganic polymers.

6. The device of claim 2 wherein said electrically insulating material is selected from the group consisting of urethanes, polyesters, epoxys, cyanate esters, polyimides, silicones, synthetic rubbers and Neoprene, nitriles, polyisoprene, fluoroelastomer, butyl and buna N elastormers and silanes, silazanes, siloxanes and ceramic sol gels inorganic polymers.

7. The device of claim 3 wherein said electrically insulating material is selected from the group consisting of urethanes, polyesters, epoxys, cyanate esters, polyimides, silicones, synthetic rubbers and Neoprene, nitrites, polyisoprene, fluoroelastomer, butyl and buna N elastomers and silanes, silazanes, siloxanes and ceramic sol gels inorganic polymers.

8. The device of claim 4 wherein said electrically insulating material is selected from the group consisting of urethanes, polyesters, epoxys, cyanate esters, polyimides, silicones, synthetic rubbers and Neoprene, nitrites, polyisoprene, fluoroelastomer, butyl and buna N elastomers and silanes, silazanes, siloxanes and ceramic sol gels inorganic polymers.

9. A method of making a device for regulating electromagnetic radiations in a predetermined frequency range, which comprises the steps of:
(a) providing a substrate having a surface;
(b) providing a coating mixture which comprises the step of suspending together a mixture of:
(i) a plurality of flakes of at least one of magnetic or ferrite material having substantial length and width dimensions relative to their thickness, the thickness of substantially all of said flakes being less than the skin depth of all frequencies in said predetermined frequency range;
(ii) at least one surfactant;
(iii) an electrically insulating material; and
(iv) a solvent;
(c) spraying said coating mixture onto said surface of said substrate; and
(d) removing said solvent to retain said flakes on said substrate spaced from each other by said electrically insulating material and disposed substantially parallel to the portion of the plane of said surface thereunder.

10. The method of claim 9 wherein said device is one of a mobile vehicle or personal electronic device and said coating is an electromagnetic wave absorber for an antenna.

11. The method of claim 9 wherein said flakes are selected from the group consisting of magnetic stainless steel, 80Ni/20Fe, sendust (FeSi/Al), amorphous CoZrNb, amorphous CoFeBSi, 95Co/5Fe, amorphous CoZrNd, CoCr and amorphous TbFe.

12. The method of claim 10 wherein said flakes are selected from the group consisting of magnetic stainless steel, 80Ni/20Fe, sendust (FeSi/Al), amorphous CoZrNb, amorphous CoFeBSi, 95Co/5Fe, amorphous CoZrNd, CoCr and amorphous TbFe.

13. The method of claim 9 wherein said electrically insulating material is selected from the group consisting of urethanes, polyesters, epoxys, cyanate esters, polyimides, silicones, synthetic rubbers and Neoprene, nitrites, polyisoprene, fluoroelastomer, butyl and buna N elastomers and silanes, silazanes, siloxanes and ceramic sol gels inorganic polymers.

14. The method of claim 10 wherein said electrically insulating material is selected from the group consisting of urethanes, polyesters, epoxys, cyanate esters, polyimides, silicones, synthetic rubbers and Neoprene, nitriles, polyisoprene, fluoroelastomer, butyl and buna N elastomers and silanes, silazanes, siloxanes and ceramic sol gels inorganic polymers.

15. The method of claim 11 wherein said electrically insulating material is selected from the group consisting of urethanes, polyesters, epoxys, cyanate esters, polyimides, silicones, synthetic rubbers and Neoprene, nitriles, polyisoprene, fluoroelastomer, butyl and buna N elastomers and silanes, silazanes, siloxanes and ceramic sol gels inorganic polymers.

16. The method of claim 12 wherein said electrically insulating material is selected from the group consisting of urethanes, polyesters, epoxys, cyanate esters, polyimides, silicones, synthetic rubbers and Neoprene, nitrites, polyisoprene, fluoroelastomer, butyl and buna N elastomers and silanes, silazanes, siloxanes and ceramic sol gels inorganic polymers.

17. The method of claim 9 wherein, of the amount of said flakes, said surfactant and said electrically insulating material contained in said mixture, said flakes are from about 40 percent to about 95 percent by weight, said surfactant is from a finite amount approaching zero to about 10 percent by weight and the amount of said electrically insulating material is sufficient to isolate said flakes from each other, said solvent being from about 20 percent to about 300 percent by weight of the weight of the remainder of said mixture.

18. The method of claim 11 wherein, of the amount of said flakes, said surfactant and said electrically insulating material contained in said mixture, said flakes are from about 40 percent to about 95 percent by weight, said surfactant is from a finite amount approaching zero to about 10 percent by weight and the amount of said electrically insulating material is sufficient to isolate said flakes from each other, said solvent being from about 20 percent to about 300 percent by weight of the weight of the remainder of said mixture.

19. The method of claim 13 wherein, of the amount of said flakes, said surfactant and said electrically insulating material contained in said mixture, said flakes are from about 40 percent to about 95 percent by weight, said surfactant is from a finite amount approaching zero to about 10 percent by weight and the amount of said electrically insulating material is sufficient to isolate said flakes from each other, said solvent being from about 20 percent to about 300 percent by weight of the weight of the remainder of said mixture.

20. The method of claim 15 wherein, of the amount of said flakes, said surfactant and said electrically insulating material contained in said mixture, said flakes are from about 40 percent to about 95 percent by weight, said surfactant is from a finite amount approaching zero to about 10 percent by weight and the amount of said electrically insulating material is sufficient to isolate said flakes from each other, said solvent being from about 20 percent to about 300 percent by weight of the weight of the remainder of said mixture.

21. The method of claim 9 wherein said step of spraying said coating mixture onto a surface of said substrate includes the step of providing a magnetic field along said surface, said step of spraying being effected while said magnetic field is disposed along said surface.

22. The method of claim 21 wherein the direction of said magnetic field is parallel to said surface.

23. A coated antenna which comprises:
  (a) an antenna; and
  (b) a coating on said antenna comprising:
    (i) a plurality of flakes of one of magnetic or ferrite material having substantial length and width dimensions relative to their thickness disposed substantially parallel to the portion of the plane of said surface thereunder;
    (ii) the thickness of substantially all of said flakes being less than the skin depth of all frequencies in said predetermined frequency range; and
    (iii) a vaporizable electrically insulating material spacing said flakes from each other.

24. The antenna of claim 23 wherein said flakes are selected from the group consisting of magnetic stainless steel, 80Ni/20Fe, sendust (FeSi/Al), amorphous CoZrNb, amorphous CoFeBSi, 95Co/5Fe, amorphous CoZrNd, CoCr and amorphous TbFe.

25. The device of claim 1 wherein said device is one of an enclosure or building having an interior surface and an exterior surface, said coating being disposed on at least one of said surfaces to absorb electromagnetic radiation and reduce electronic interference.

26. The device of claim 9 wherein said device is one of an enclosure or building having an interior surface and an exterior surface and said coating is disposed on at least one of said surfaces to absorb electromagnetic radiation and reduce electronic interference.

* * * * *